(12) United States Patent
Jain et al.

(10) Patent No.: US 8,642,424 B2
(45) Date of Patent: Feb. 4, 2014

(54) REPLACEMENT METAL GATE STRUCTURE AND METHODS OF MANUFACTURE

(75) Inventors: Sameer H. Jain, Beacon, NY (US); Jeffrey B. Johnson, Essex Junction, VT (US); Ying Li, Newburgh, NY (US); Hasan M. Nayfeh, Poughkeepsie, NY (US); Ravikumar Ramachandran, Pleasantville, NY (US)

(73) Assignee: International Business Machines Corporation, Armonk, NY (US)

( * ) Notice: Subject to any disclaimer, the term of this patent is extended or adjusted under 35 U.S.C. 154(b) by 103 days.

(21) Appl. No.: 13/180,842

(22) Filed: Jul. 12, 2011

(65) Prior Publication Data

US 2013/0015580 A1 Jan. 17, 2013

(51) Int. Cl.
*H01L 21/336* (2006.01)

(52) U.S. Cl.
USPC ........... 438/259; 438/270; 438/271; 438/589; 438/591; 257/330; 257/E21.428

(58) Field of Classification Search
USPC .......... 257/704, 330, E21.428; 438/259, 270, 438/271, 589, 591
See application file for complete search history.

(56) References Cited

U.S. PATENT DOCUMENTS

| | | | |
|---|---|---|---|
| 6,406,945 B1 | 6/2002 | Lee et al. | |
| 6,586,288 B2 * | 7/2003 | Kim et al. | 438/183 |
| 7,008,835 B2 | 3/2006 | Jin et al. | |
| 7,227,230 B2 | 6/2007 | Gambino et al. | |
| 7,365,015 B2 | 4/2008 | Lin et al. | |
| 7,718,479 B2 | 5/2010 | Kavalieros et al. | |
| 7,745,889 B2 | 6/2010 | Lin et al. | |
| 7,888,220 B2 | 2/2011 | Rachmady et al. | |
| 2001/0027005 A1 * | 10/2001 | Moriwaki et al. | 438/592 |
| 2005/0040465 A1 * | 2/2005 | Park et al. | 257/347 |
| 2006/0113568 A1 * | 6/2006 | Chan et al. | 257/204 |
| 2007/0262451 A1 | 11/2007 | Rachmady et al. | |
| 2008/0258234 A1 | 10/2008 | Henson et al. | |
| 2009/0224338 A1 * | 9/2009 | Nagaoka | 257/410 |
| 2010/0065926 A1 * | 3/2010 | Yeh et al. | 257/410 |
| 2012/0256278 A1 * | 10/2012 | Zhang et al. | 257/411 |

* cited by examiner

*Primary Examiner* — Andy Huynh
(74) *Attorney, Agent, or Firm* — Steven Meyers; Roberts Mlotkowski Safran & Cole, P.C.

(57) ABSTRACT

A replacement metal gate structure and methods of manufacturing the same is provided. The method includes forming at least one trench structure and forming a liner of high-k dielectric material in the at least one trench structure. The method further includes adjusting a height of the liner of high-k dielectric material. The method further includes forming at least one workfunction metal over the liner, and forming a metal gate structure in the at least one trench structure, over the at least one workfunction metal and the liner of high-k dielectric material.

22 Claims, 10 Drawing Sheets

REPLACEMENT METAL GATE STRUCTURE AND METHODS OF MANUFACTURE

FIELD OF THE INVENTION

The invention generally relates to semiconductor structures and, in particular, to a replacement metal gate structure and methods of manufacturing the same.

BACKGROUND

Capacitive coupling is often caused when one signal capacitively couples with another. One of the major sources of capacitive coupling (also referred to as parasitic capacitance coupling) is from the source and drain to substrate junctions of a transistor.

At low frequencies, parasitic capacitance coupling can usually be ignored, but in high frequency circuits it becomes a major problem in limiting device performance. For example, in high-frequency circuits, e.g., 5 GHz and above, parasitic capacitance coupling to the substrate limits the switching frequency. Accordingly, if the parasitic capacitance coupling can be reduced, the transistor can be switched faster and hence increase its performance. For this reason, high frequency circuits require special design techniques to improve switching and hence performance of the transistor.

Recent advances in technology have begun to address the issue of capacitive coupling. For example, these problems are being avoided by making circuits on insulating substrates (e.g., silicon dioxide or sapphire) that have a thin layer of crystalline silicon, in which the FET is fabricated. Silicon-on-Insulator (SOI) technologies are also addressing this issue. For example, SOI can reduced the capacitance at the source and drain junctions by eliminating the depletion regions extending into the substrate. However, further advances are still required as devices are scaled.

Accordingly, there exists a need in the art to overcome the deficiencies and limitations described hereinabove.

SUMMARY

In a first aspect of the invention, a method comprises forming at least one trench structure and forming a liner of high-k dielectric material in the at least one trench structure. The method further comprises adjusting a height of the liner of high-k dielectric material, and forming at least one workfunction metal over the liner. The method further comprises forming a metal gate structure in the at least one trench structure, over the at least one workfunction metal and the liner of high-k dielectric material.

In an another aspect of the invention, a method comprises forming a sacrificial gate structure on an interface layer, over a first type of device and a second type of device. The method further comprises forming stress material on the sacrificial gate structure, and forming a gap material on the stress material. The method further comprises polishing the stress material, the gap material and portions of the sacrificial gate structure to expose material of the sacrificial gate structure. The method further comprises removing the sacrificial gate structure to form a first trench over the first type of device and a second trench over the second type of device. The method further comprises forming a liner of high-k dielectric material with a k value of 20 or greater in the first trench and the second trench and adjusting a height of the liner of high-k dielectric material with an etching process. The method further comprises forming a metal gate structure in the first trench and the second trench and over the liner of high-k dielectric material and at least one workfunction metal.

In yet another aspect of the invention, a device comprises a trench structure formed of a stress material, and with a bottom surface comprising an interface layer over a well of a first device. The device further comprises a high-k dielectric material with a high-k value of about 20 or greater which lines the trench, and which is pulled down a predetermined distance from a top surface of the trench structure. The device further comprises a work function metal on the high-k dielectric material and portions of the sidewall of the trench, a metal gate structure which fills the trench structure and is on the work function metal.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of a replacement metal gate structure (RMG), which comprises the structures of the present invention. In still further embodiments, a method in a computer-aided design system is provided for generating a functional design model of the RMG. The method comprises generating a functional representation of the structural elements of the RMG.

BRIEF DESCRIPTION OF THE SEVERAL VIEWS OF THE DRAWINGS

The present invention is described in the detailed description, which follows, in reference to the noted plurality of drawings by way of non-limiting examples of exemplary embodiments of the present invention.

DETAILED DESCRIPTION

Figure 1:
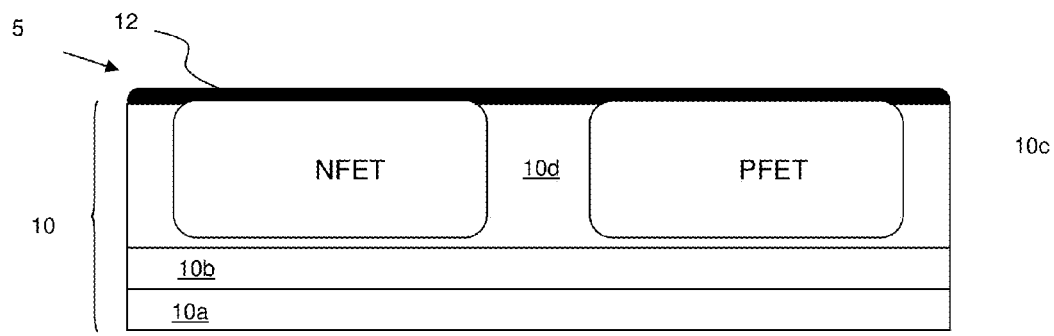
FIGS. 1-15 show fabrication processes and respective structures in accordance with aspects of the invention.

The invention generally relates to semiconductor structures and, in particular, to a replacement metal gate structure and methods of manufacturing the same. More particularly, the present invention relates to front end of the line (FEOL) processes for fabricating a metal gate structure, using replacement metal gate processes. In embodiments, the present invention implements a high-k dielectric liner into the process flow, which results in lower Ceff and hence reduction of outer-fringe capacitance. In embodiments, the amount of outer-fringe capacitance reduction is significant due to the use of a high-k dielectric material liner, e.g., $HFO_2$, in a metal gate device.

Advantageously, the metal gate structure of the present invention provides improved Ceff over conventional structures. For example, a 22 nm metal gate structure with the high-k dielectric material has a 12% higher Ceff than a metal gate structure with an airgap. In embodiments, the impact on an $SiO_2$ ring oscillator is about 3% frequency increase for a significant amount of pull-down from the top of the gate electrode.

FIGS. 1-15 show fabrication processes and respective structures in accordance with aspects of the invention. More specifically, the structure 5 of FIG. 1 includes a substrate 10. The substrate 10 can be, for example, BULK or SOI (silicon on insulator). In the SOI implementation, the substrate 10 includes a wafer or substrate 10a, an insulator layer 10b, also referred to as BOX, and a semiconductor layer 10c. The semiconductor layer 10c can be an active silicon material, for example.

In embodiments, an NFET and PFET are formed in the semiconductor layer 10c using conventional dopants. For example, the NFET can be formed by a phosphorous or arsenic doping or implantation process; whereas, the PFET can be formed by a boron doping or implantation process. A shallow trench isolation structure 10d is formed between the NFET and the PFET using conventional CMOS processes, e.g., lithography, etching and deposition. The shallow trench isolation structure 10d can comprise any insulator material such as, for example, oxide.

Still referring to FIG. 1, a thin interface layer 12 is formed on the structure, e.g., over the NFET and PFET. The interface layer 12 can be formed using, for example, any conventional deposition processes such as, for example, atomic layer deposition (ALD). In embodiments, the interface layer 12 is a oxynitride layer, deposited to a depth of about 5 Å to 10 Å.

Figure 2:
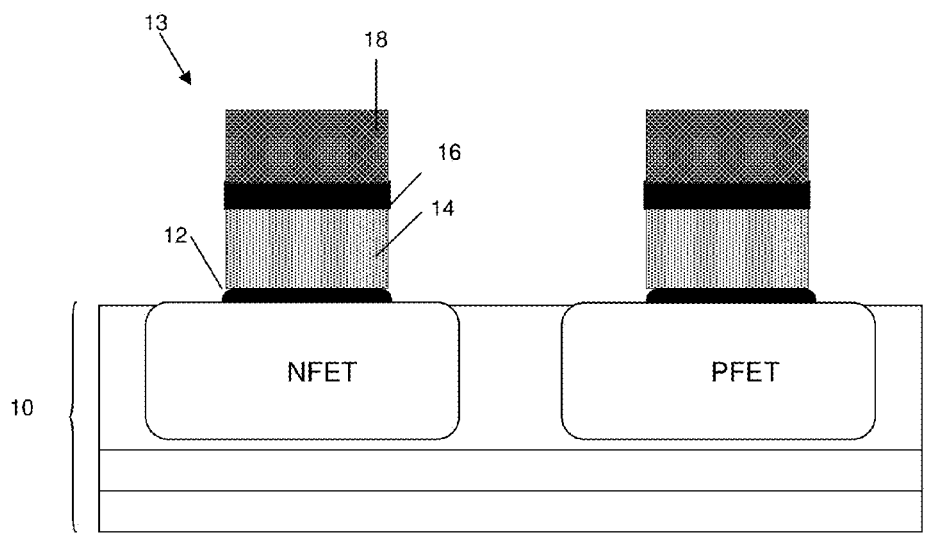

FIG. 2 shows the formation of a replacement metal gate structure 13, e.g., sacrificial gate structure, in accordance with aspects of the present invention. In particular, an amorphous silicon (Si) layer 14, e.g., polysilicon, is deposited on the interface layer 12 using conventional deposition or growth processes. For example, the Si layer 14 can be deposited using a conventional chemical vapor deposition (CVD) process. In embodiments, the Si layer 14 is deposited to about 500 Å; although other dimensions are contemplated by the present invention, as a function of the technology node. An insulator material 16 is deposited on the Si layer 14. The insulator layer 16 may be, for example, oxide. A hardmask 18, e.g., nitride, is deposited on the insulator material 16. In embodiments, the hardmask 18 is instrumental in the patterning process, while protecting the underlying layers, e.g., interface layer 12 and Si layer 14. The hardmask 18, in embodiments, can undergo a polishing step such as, for example, a chemical mechanical polishing process (CMP).

Still referring to FIG. 2, in embodiments, the layers 12, 14, 16 and 18 undergo a conventional patterning process to form the replacement gate structure 13 on the NFET and the PFET. For example, a resist is formed on the hardmask 18, which is exposed to energy to form a pattern. The underlying layers 12, 14, 16 and 18 are then patterned using, for example, a conventional etching process, e.g., reactive ion etching (RIE). The resist can then be removed using a conventional ashing process, for example.

Figure 3:
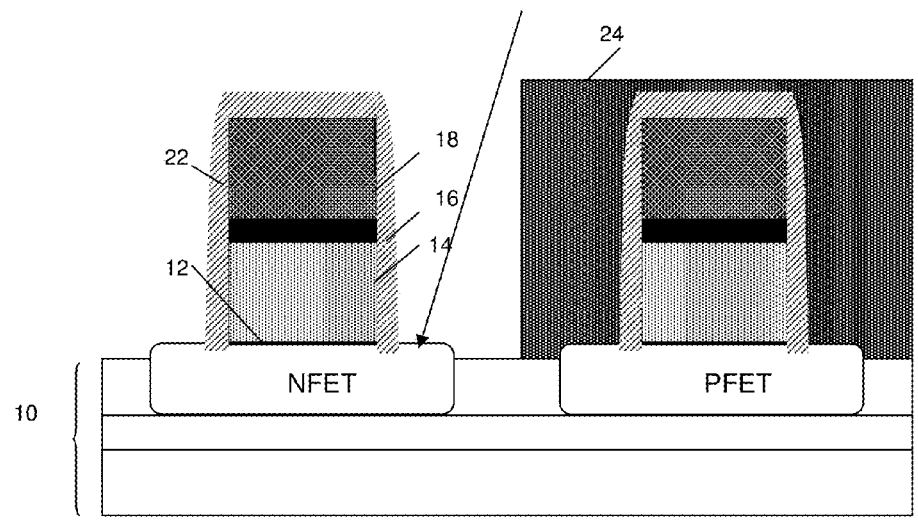

In FIG. 3, extension and halo implants are provided for both the NFET and the PFET. Although such process is only shown for the NFET in FIG. 3, it should be understood that that same processes are also used for the extension and halo implants of the PFET. In particular, sidewalls 22 are formed on the replacement metal gate structure 13 using conventional deposition processes. For example, a nitride material can be formed on the sidewalls of the replacement metal gate structure 13 using a chemical vapor deposition process. A block resist 24 is formed over the PFET using conventional CMOS processes. For the NFET, an N-type extension implant and a P-type halo implant is performed using conventional processes. For the PFET, a P-type extension implant and an N-type halo implant is performed using conventional processes. In embodiments, the angle of implant can be about 25 degrees; or other angles which would avoid blocking from the block resist 24.

Figure 4:
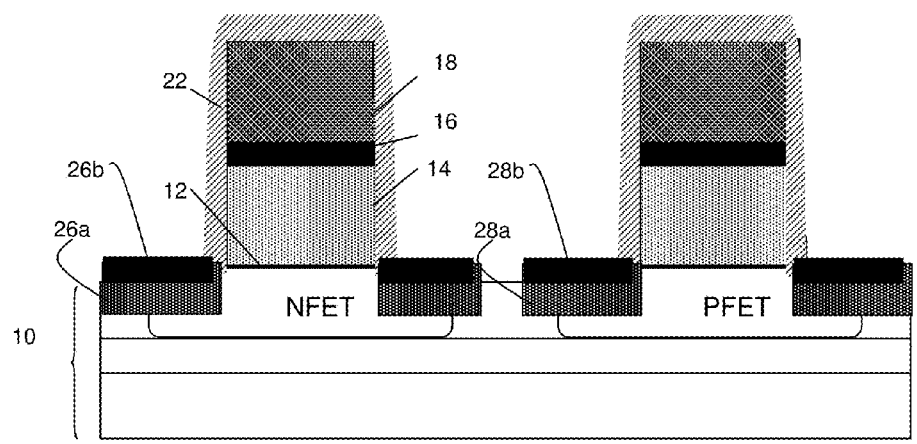

In FIG. 4, dual embedded source and drains are provided for the NFET and PFET in accordance with aspects of the present invention. The dual embedded source and drains can be formed by, for example, forming a trench on the sides of the NFET and PFET and filling the trenches with material. For example, the trenches for the NFET can be filled with embedded SiC and doped with phosphorous to form the source and drain 26a of the NFET. The trenches for the PFET can be filled with embedded SiGe and doped with boron to form the source and drain 28a of the PFET. An annealing process can then be formed to activate the source and drain regions, which result in NiSi regions 26b and 28b on the NFET and PFET, respectively.

Figure 5:
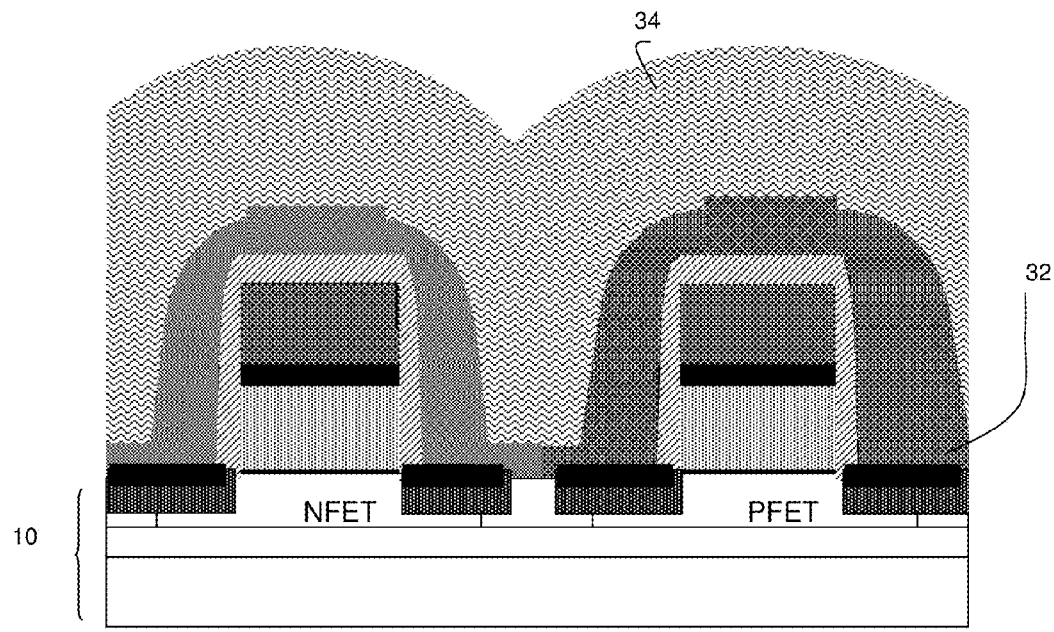

In FIG. 5, a stress material 32 is deposited on the structures, e.g., replacement metal gate structures 13. In embodiments, the stress material is 32 is a nitride material, deposited using a conventional deposition process, e.g., CVD. The stress material 32 can be deposited to about 15 to 30 nm; although other dimensions are contemplated by the present invention depending on the desired stress component. In embodiments, the stress material 32 will form a tensile stress over the NFET; whereas, the stress material 32 will form a compressive stress over the PFET. A gap fill material 34 is deposited on the stress material 32. In embodiments, the gap fill material 34 can be oxide or undoped silicon glass, for example. The gap fill material 34 can be deposited to a depth of about 2000 Å, or other depths that will fill in any gaps.

Figure 6:
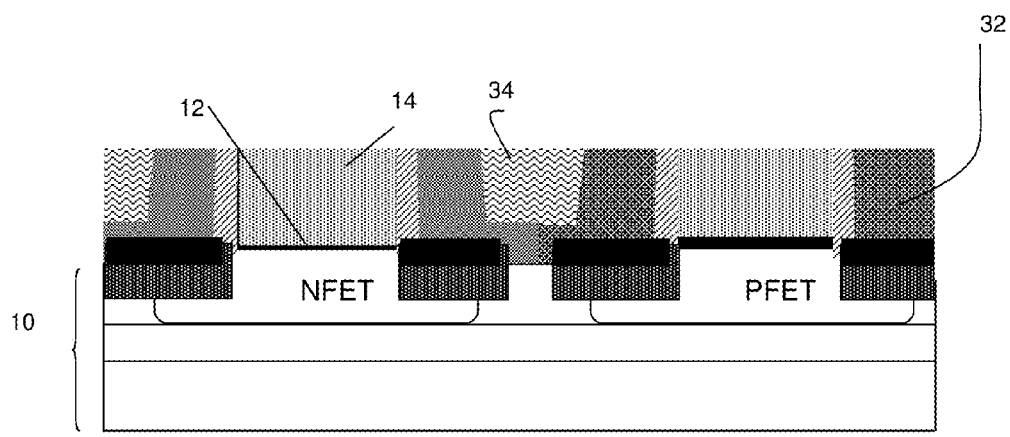

In FIG. 6, the structure undergoes a polishing process such as, for example, a chemical mechanical polishing (CMP). More particularly, a CMP process exposes the underlying Si layer 14 by removing portions of the gap fill material 34 and stress material 32, in addition to the hardmask 18 and insulator layer 16. In embodiments, the polishing process results in a height of the underlying Si layer 14 of about 400 Å+/−75 Å.

Figure 7:
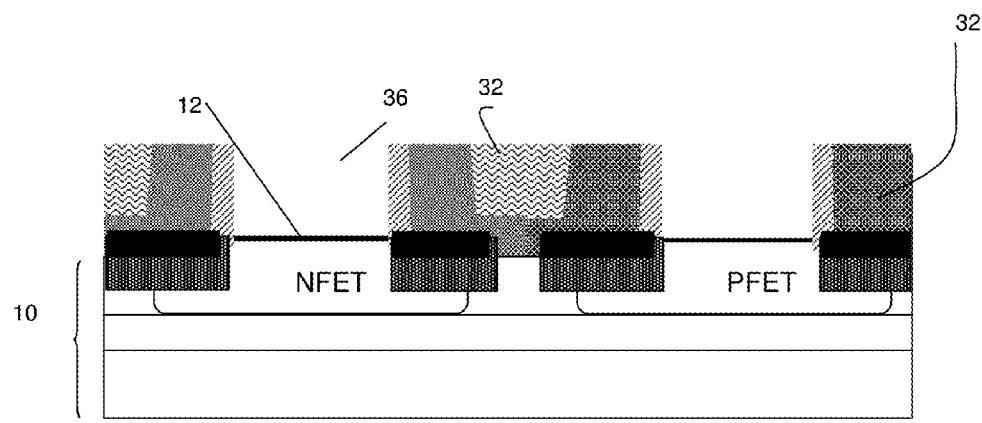

In FIG. 7, the underlying Si layer 14 is removed using, for example, a selective etchant to the underlying Si layer 14. In embodiments, the interface layer 12 remains intact during the removal process of the underlying Si layer 14. More specifically, the underlying Si layer 14 can be removed to form a trench 36, using an HF deglaze at about 65° C. using, for example, $NH_4OH$. Alternatively, the removal process can be a cold process such as, for example, TMAH solution. In embodiments, the interface layer 12 may be etched about 1 Å to about 2 Å to remove any residual material.

Figure 8:
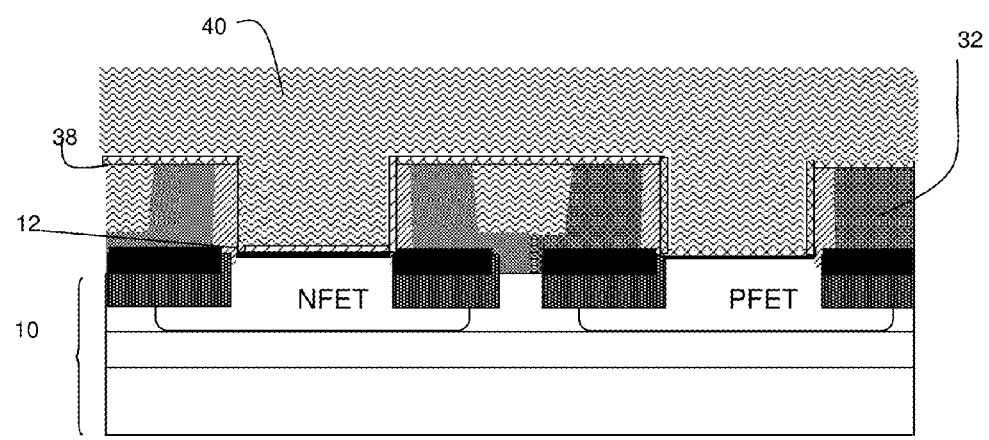

In FIG. 8, a high-k dielectric material 38 is deposited within the trench 36 to form a liner of high-k dielectric material. The high-k dielectric material 38 can be deposited using, for example, conventional processes such as, for example, CVD or ALD. In embodiments, the high-k dielectric material 38 has a k value of 20 or greater. In embodiments, the high-k dielectric material 38 can be, for example, $HFO_2$ or $HfSiO_x$; although other high-k dielectric materials are also contemplated by the present invention. The high-k dielectric material 38 can be deposited to a depth of about 15 Å to about 20 Å; although other dimensions are also contemplated by the present invention. A resist or an anti reflective coating (or other masking layer) 40 is deposited on the high-k dielectric material 38, filling the trench 36.

Figure 9:
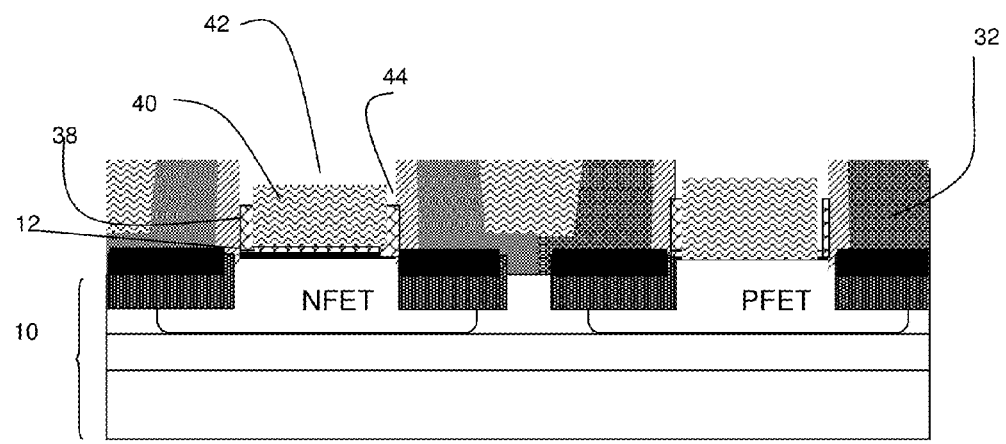

In FIG. 9, a recess 42 is formed in the resist or an anti reflective coating (or other masking layer) 40 using any conventional patterning processes such as, for example, an etching processes. More specifically, the resist (or other masking layer) 40 can be recessed to below a top surface of the trench to form a resist recess. The recess 42 can be tuned to different heights, depending on the patterning process and desired device performance. For example, the recess 42 can be about 50 Å to about 150 Å (as measured from the top of the resist surface). In addition, the high-k dielectric material 38 can be etched on the sidewalls of the trench to form a pullback 44 using, for example, a RIE process with an over-etch beyond the resist material 40. In embodiments, the pullback 44 can be etched by using a timed etch of diluted HF, including a fluorine based wet etch chemistry or $BCl_3/Cl_2$ based RIE etch chemistry. The pullback 44 can range for example, 150 to 350 Å, depending on the original dimensions of the high-k dielectric material 38.

Figure 10:
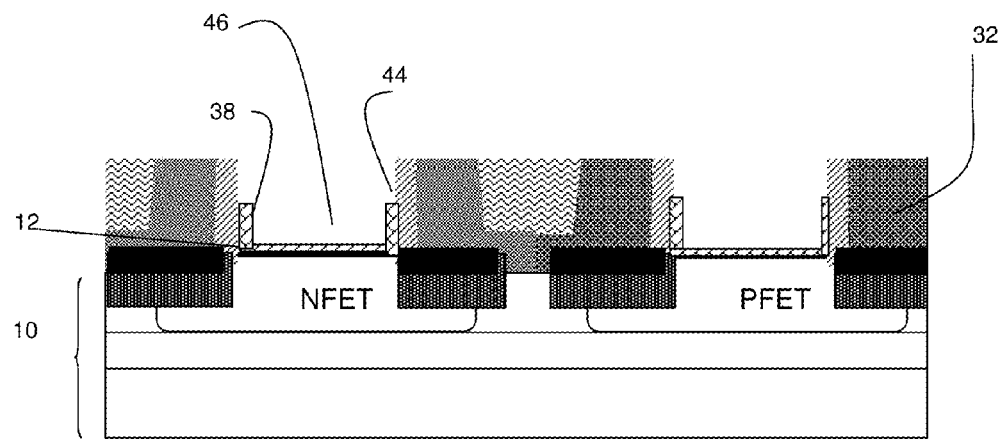

In FIG. 10, the remaining portions of the resist (or other masking layer) 40 are removed using, for example, a resist ashing process. The resist ashing process will not significantly affect the high-k dielectric material 38. The removal of the resist will form a trench 46 of about 400 Å+/−75 Å.

Figure 11:
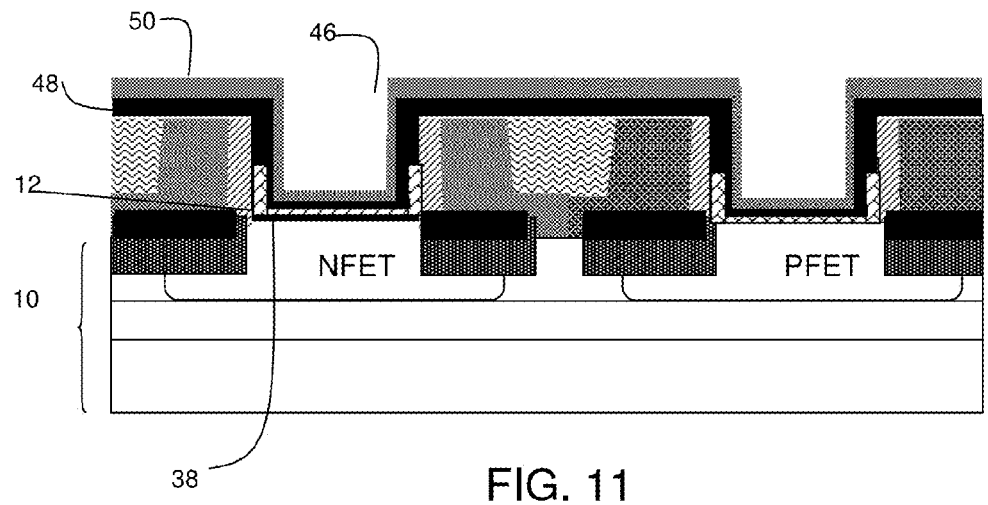

As shown in FIG. 11, a capping layer 48 is deposited within the trench 46 and remaining surfaces of the structure of FIG. 10. In embodiments, the capping layer 48 is a metal layer, deposited using an ALD process. The capping layer 48 can be any appropriate material such as TiN deposited to a depth of about 10 Å to about 20 Å; although other thicknesses are also contemplated by the present invention depending on the desired workfunction of the device. In embodiments, the deposition of the capping layer 48 will result in a width of the trench 48 of about 280 Å.

An additional metal layer 50 is deposited on the capping layer 48, for setting the workfunction of the NFET and the PFET. For example, the metal layer 50 may be, for example, TaN, deposited to a depth of about 10 Å to about 20 Å; although other thicknesses are also contemplated by the present invention depending on the desired workfunction of the device.

Figure 12:
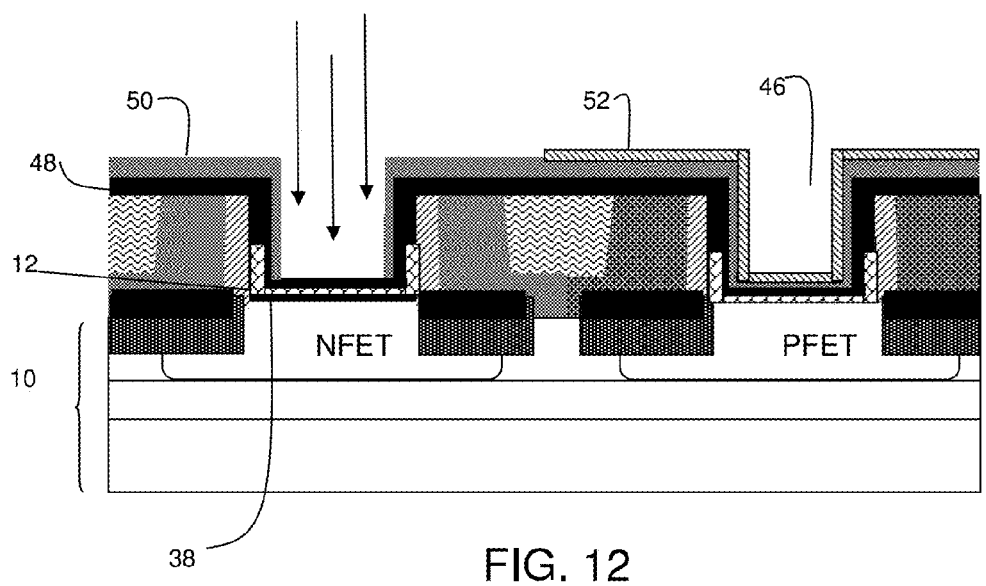

In FIG. 12, a capping layer 52 is deposited over the metal layer 50, on the PFET side of the structure. In embodiments, the capping layer 52 can be deposited and patterned using conventional CMOS processes to form the capping layer 52 on the PFET side of the structure. In embodiments, the capping layer 52 is any appropriate material, e.g., TiN, which protects the PFET side of the device during subsequent processing. For example, in embodiments, the TaN layer 50, on the NFET side of the structure, may be etched back, e.g., using an argon sputter, to perforate the TaN layer 50, in order to allow a path for the N-well workfunction metal, e.g., TaN, to intermix with the TiN capping layer. This process will allow for adjustment to the workfunction of the TaN metal. In embodiments, the argon sputter can completely remove the metal layer 50 at a bottom of the trench, on the NFET side of the structure; although, in embodiments, a certain amount of the metal layer 50, e.g., about 10 Å or less, can remain after the argon sputter etch. The TiN layer will protect the underlying TaN layer on the PFET side of the structure, during the sputter etching on the NFET side of the structure.

Figure 13:
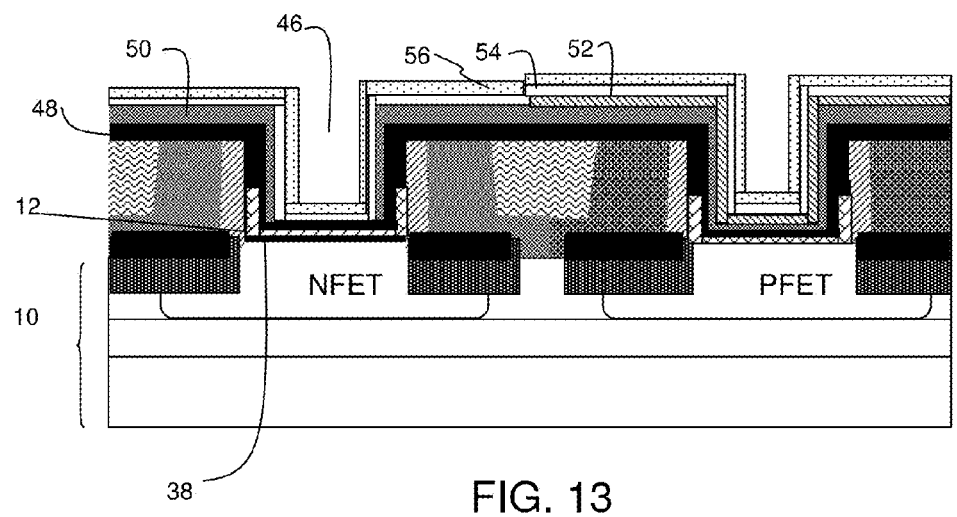

In FIG. 13, a metal layer 54 is deposited on the metal layer 52, metal layer 50 and the exposed portion of the trench, e.g., exposed TaN layer in the trench on the NFET side of the structure. In embodiments, the metal layer 54 can be, for example, TiAl, deposited using a RF plasma vapor deposition (RFPVD) process. In embodiments, the TiAl can be used for adjusting a workfunction of the NFET device of the structure. The ratio of TiAl can be about 1:1, for example. A metal seal layer 56, e.g., TiN or TaN material, is deposited on the metal layer 54. The metal seal layer 56 can protect the workfunction metals from Al fill and prevent Al spiking, for example. The metal seal layer 56 may be deposited using, for example, an ALD or metal sputtering.

Figure 14:
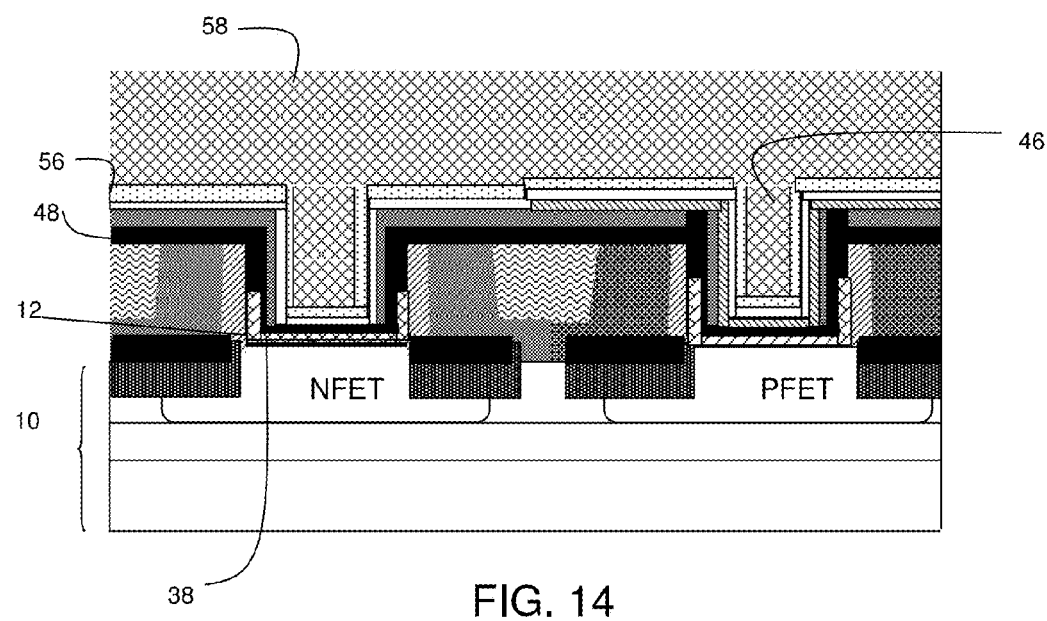

As shown in FIG. 14, a bulk Al fill material 58 is deposited on the metal seal layer 56. In embodiments, the bulk Al fill material can comprise, for example, a Ti wetting for adhesion and nucleation, followed by a Al seed layer to improve Al hot nucleation in small trenches. Aluminum is then deposited. In embodiments, the Al can be deposited in a hot reflow bulk fill process at a temperature ranging from about 400° C. to about 450° C. Alternatively, the Al can be deposited using a cold and hot process such as, for example, a CVD process followed by the hot reflow process. As shown in these processes, the bulk Al fill material 58 will fill in the trenches 46, thus forming a metal gate.

Figure 15:
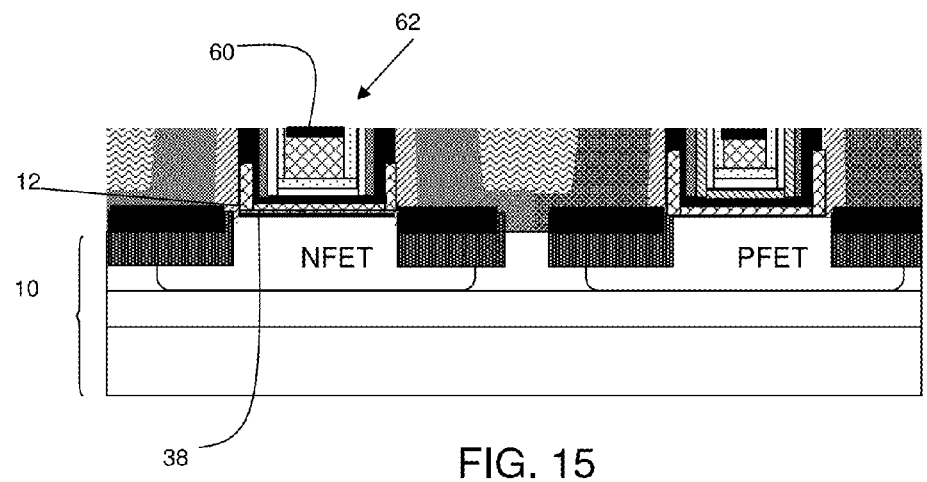

In FIG. 15, the bulk Al fill material 58 is planarized using, for example, an Al CMP process, which is highly selective to oxide. In embodiments, the CMP process will also etch the metal layers 48, 50, 52, 54 and 56 on a surface the structure. The Al CMP process will result in a layer 60 of, for example, AlOx, on the top of the metal gate structure 62. Advantageously, the resultant structure includes the high-k dielectric material 38 on the sides of the metal gate structure 62, at a certain pullback distance. As should be understood, the pullback distance can be adjusted by the etching of the high-k dielectric material, to tune device performance.

Figure 16:
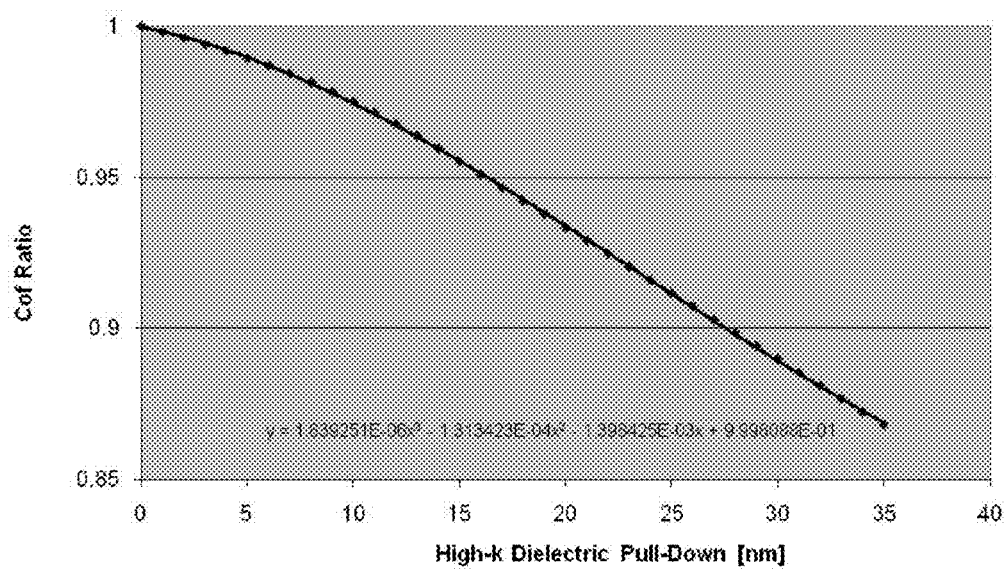
FIG. 16. shows a performance graph of a capacitance ratio vs. a pull-down of a high-k dielectric liner in accordance with aspects of the invention.

FIG. 16. shows a performance graph of a capacitance ratio vs. a pull-down of a high-k dielectric liner in accordance with aspects of the invention. As shown in FIG. 16, the Ceff of the device will decrease as the pull down of the high-k dielectric material 38 increases. For example, a capacitance ratio of 1 results with no pull down of the high-k dielectric material 38 of 0 nm; whereas, a capacitance ratio of 0.87 results with a pull down of the high-k dielectric material 38 of 35 nm. Accordingly, the lower Ceff of the present invention can increase the switching performance of the devices, which can be adjusted with the pull down of the high-k dielectric material 38.

Figure 17:
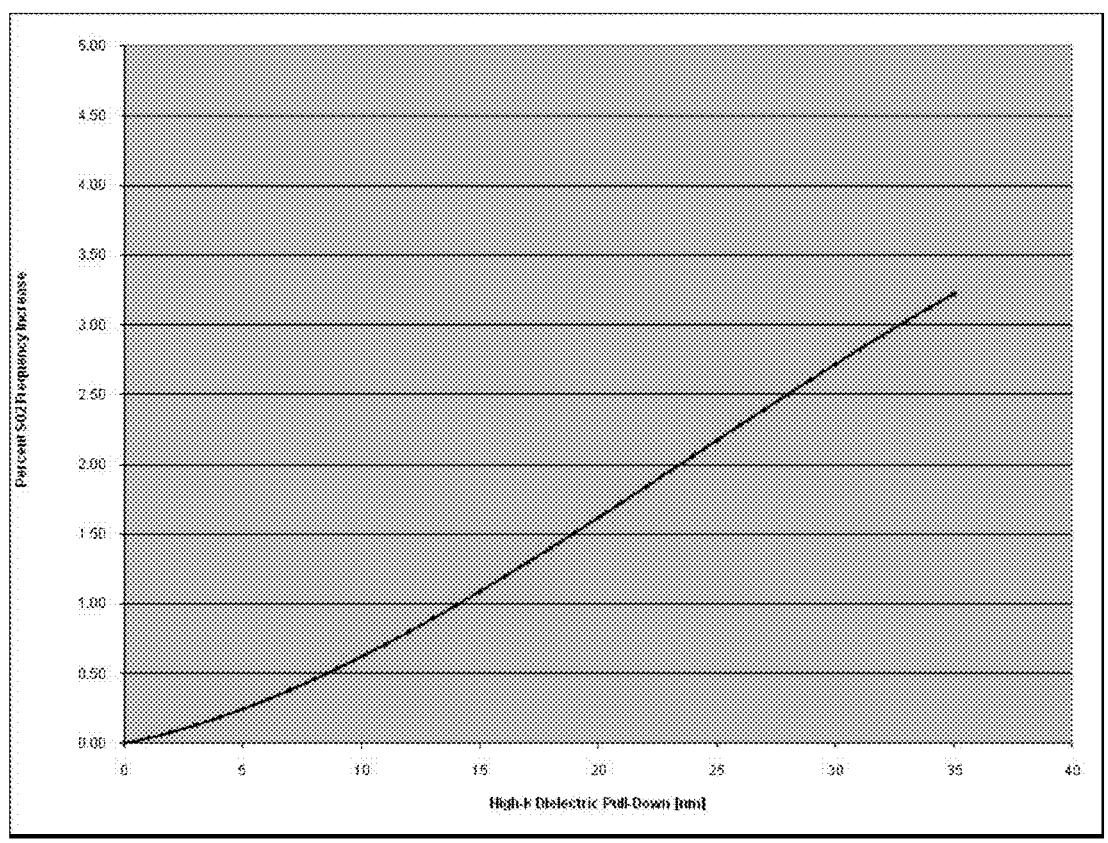
FIG. 17 shows a performance graph of a frequency increase vs. a pull-down of a high-k dielectric liner in accordance with aspects of the invention.

FIG. 17 shows a performance graph of a frequency increase vs. a pull-down of a high-k dielectric liner in accordance with aspects of the invention. In embodiments, FIG. 17 shows that the frequency of the device will increase with an increase pull down of the high-k dielectric layer 38. For example, a pull down of about 30 nm will provide a 2% to 3% increase in frequency of the circuit. Accordingly by adjusting the pull down, it is possible to adjust the switching frequency of the device, e.g., the more pull down of the high-k dielectric layer 38 will increase the switching frequency of the device.

Figure 18:
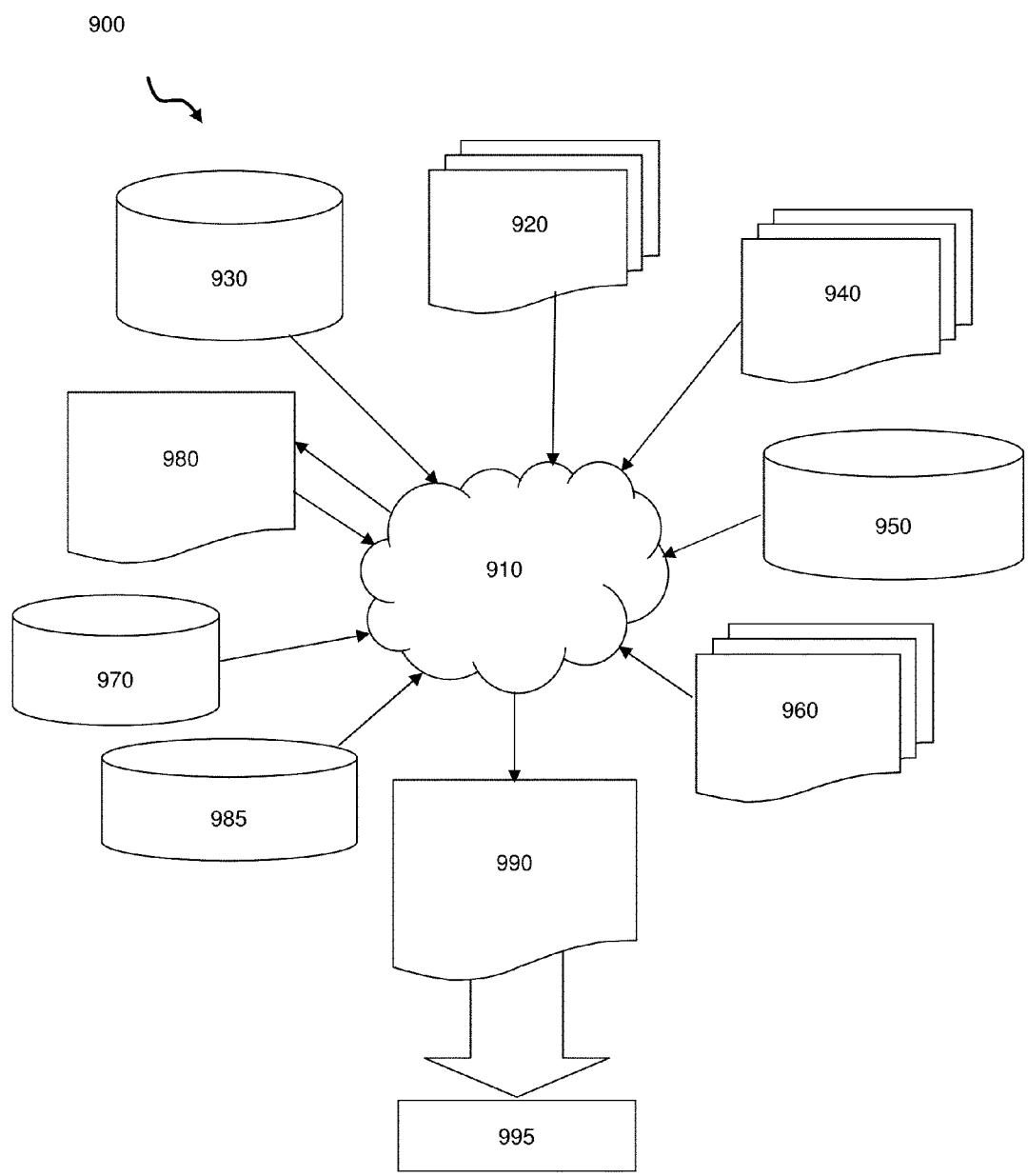
FIG. 18 is a flow diagram of a design process used in semiconductor design, manufacture, and/or test.

FIG. 18 is a flow diagram of a design process used in semiconductor design, manufacture, and/or test. FIG. 18 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-15. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include:

lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 18 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-15. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-15 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-15. In one embodiment, design structure 990 may comprise a compiled, executable HDL simulation model that functionally simulates the devices shown in FIGS. 1-15.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-15. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims, if applicable, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principals of the invention and the practical application, and to enable others of ordinary skill in the art to understand the invention for various embodiments with various modifications as are suited to the particular use contemplated. Accordingly, while the invention has been described in terms of embodiments, those of skill in the art will recognize that the invention can be practiced with modifications and in the spirit and scope of the appended claims.

What is claimed:

1. A method comprising:
    forming at least one trench structure;
    forming a liner of high-k dielectric material in the at least one trench structure;
    adjusting a height of the liner of high-k dielectric material;
    forming at least one workfunction metal on the liner of high-k dielectric material; and
    forming a metal gate structure in the at least one trench structure, over at least one workfunction metal and the liner of high-k dielectric material, wherein:
    after forming the liner, filling the at least one trench structure with a resist, over the liner of high-k dielectric material;
    prior to adjusting the height of the liner, recessing the resist in the at least one trench structure; and
    subsequent to the adjusting, removing remaining resist in the at least one trench structure.

2. The method of claim 1, wherein the high-k dielectric material has a k value of 20 or greater.

3. The method of claim 1, wherein the high-k dielectric material is one of $HFO_2$ and $HfSiO_x$.

4. The method of claim 1, wherein the forming the at least one trench structure comprises:
    forming a sacrificial gate structure;
    forming a stress material about the sacrificial gate structure;
    forming a gap material on the stress material;
    polishing the stress material, the gap material and a portion of the sacrificial gate structure, to expose material of the sacrificial gate structure; and
    removing remaining material of the sacrificial gate structure to form the at least one trench structure.

5. The method of claim 4, wherein the stress material is a nitride material which causes a tensile stress on a NFET and a compressive stress on a PFET.

6. The method of claim 4, wherein the forming the sacrificial gate structure comprises:
    forming an amorphous silicon layer on an interface layer;
    forming an insulator layer on the amorphous silicon layer;
    forming a hardmask on the insulator layer; and
    patterning the interface layer, the amorphous silicon layer, the insulator and the hardmask.

7. The method of claim 6, wherein the polishing exposes the amorphous silicon layer, and the removing remaining material comprises removing the amorphous silicon layer.

8. The method of claim 7, further comprising etching a portion of the interface layer to remove any residual material, prior to depositing the at least one workfunction metal and metal for the metal gate structure.

9. A method comprising:
    forming at least one trench structure;
    forming a liner of high-k dielectric material in the at least one trench structure;
    adjusting a height of the linter of high-k dielectric material;
    forming at least one workfunction metal on the liner of high-k dielectric material; and
    forming a metal gate structure in the at least one trench structure, over at least one workfunction metal and the liner of high-k dielectric material, wherein:
    forming the liner of high-k dielectric material comprises forming high-k dielectric material on an interface layer forming a bottom of the at least one trench, and sidewalls of the at least one trench structure;
    adjusting the height of the liner of high-k dielectric material comprises etching the high-k dielectric material to below a height of a resist which was recessed in the at least one trench structure; and
    forming the metal gate structure comprises:
        forming the at least one workfunction metal on the liner of high-k dielectric material and on exposed sidewalls of the at least one trench structure; and
        forming a metal on the at least one workfunction metal.

10. The method of claim 9, wherein the metal is a bulk fill Al.

11. A method comprising:
    forming at least one trench structure;
    forming a liner of high-k dielectric material in the at least one trench structure;
    adjusting a height of the linter of high-k dielectric material;
    forming at least one workfunction metal on the liner of high-k dielectric material; and
    forming a metal gate structure in the at least one trench structure, over at least one workfunction metal and the liner of high-k dielectric material, wherein:
    forming the metal gate structure comprises forming the at least one workfunction metal on the liner of high-k dielectric material and on exposed sidewalls of the at least one trench, wherein forming the at least one workfunction metal comprises:

forming a capping layer within the at least one trench structure and on the liner of high-k dielectric material;

forming an additional metal layer on the capping layer;

protecting the capping layer and the additional metal layer on a first type of device; and etching the additional metal layer on a second type of device to allow a path for the additional metal layer to intermix with the capping layer to adjust a workfunction of the second type of device.

12. The method of claim 11, wherein the etching is an argon sputter that completely or almost completely removes the additional metal layer at a bottom of the at least one trench structure of the second type of device.

13. The method of claim 11, wherein the protecting comprising forming a TiN layer over the first type of device, prior to the argon sputter on the second type of device.

14. The method of claim 11, wherein:

the additional metal layer is TaN, deposited to a depth of about 10 Å to about 20 Å;

the capping layer is TiN deposited to a depth of about 10 Å to about 20 Å;

the additional metal layer is TiN; and further comprising depositing TiAl for adjusting a workfunction of the second type of device.

15. The method of claim 14, further comprising forming a metal seal layer to protect workfunction metals from Al fill and prevent Al spiking.

16. A method, comprising:

forming a sacrificial gate structure on an interface layer, over a first type of device and a second type of device;

forming stress material on the sacrificial gate structure;

forming a gap material on the stress material;

polishing the stress material, the gap material and portions of the sacrificial gate structure to expose material of the sacrificial gate structure;

removing the sacrificial gate structure to form a first trench over the first type of device and a second trench over the second type of device;

forming a liner of high-k dielectric material with a k value of 20 or greater in the first trench and the second trench;

adjusting a height of the liner of high-k dielectric material with an etching process; and forming a metal gate structure in the first trench and the second trench and over the liner of high-k dielectric material and at least one workfunction metal.

17. The method of claim 16, wherein forming the metal gate structure comprises forming the at least one workfunction metal in the first trench and the second trench, prior to filling the first trench and the second trench with a bulk metal fill material.

18. The method of claim 17, further comprising adjusting a workfunction value of the at least one workfunction metal for the first type of device by a sputter etch while protecting the at least one workfunction metal for the second type of device.

19. The method of claim 16, wherein the high-k dielectric material is one of $HFO_2$ and $HfSiO_x$.

20. The method of claim 16, further comprising adjusting a height of the liner of high-k dielectric material by etching the high-k dielectric material to below a height of a resist deposited within the first trench and the second trench.

21. The method of claim 16, wherein forming the metal gate structure comprises forming the at least one workfunction metal on the liner of high-k dielectric material and on exposed sidewalls of the at least one trench, wherein forming at least one workfunction metal comprises:

forming a capping layer within the at least one trench and on the liner of high-k dielectric material;

forming an additional metal on the capping layer;

protecting the capping layer and the additional metal layer on the second type of device; and etching the additional metal layer on the first type of device to allow a path for the additional metal to intermix with the capping layer to adjust a workfunction of the first type of device, wherein the etching is an argon sputter that completely or almost completely removes the additional metal at a bottom of the first trench and the second trench, the protecting comprising forming a TiN layer over the second type of device, prior to the argon sputter on the first type of device.

22. A device, comprising:

a trench structure formed of a stress material, and with a bottom surface comprising an interface layer over a well of a first device and sidewall structures formed on direct contact with the stress material;

a high-k dielectric material with a high k value of about 20 or greater lining the trench, and which is pulled down a predetermined distance from a top surface of the trench structure;

a work function metal on the high-k dielectric material and portions of the sidewall of the trench; and a metal gate structure filling the trench structure and being on the work function metal.

* * * * *